US012400967B2

(12) United States Patent
Chen et al.

(10) Patent No.: US 12,400,967 B2
(45) Date of Patent: Aug. 26, 2025

(54) EMBEDDED PACKAGING STRUCTURE AND MANUFACTURING METHOD THEREOF

(71) Applicant: Nantong ACCESS Semiconductor CO., LTD., Jiangsu Province (CN)

(72) Inventors: Xianming Chen, Jiangsu Province (CN); Lei Feng, Jiangsu Province (CN); Benxia Huang, Jiangsu Province (CN); Yue Bao, Jiangsu Province (CN); Wenshi Wang, Jiangsu Province (CN)

(73) Assignee: NANTONG ACCESS SEMICONDUCTOR CO., LTD., Jiangsu Province (CN)

( * ) Notice: Subject to any disclaimer, the term of this patent is extended or adjusted under 35 U.S.C. 154(b) by 785 days.

(21) Appl. No.: 17/691,403

(22) Filed: Mar. 10, 2022

(65) Prior Publication Data

US 2022/0302037 A1    Sep. 22, 2022

(30) Foreign Application Priority Data

Mar. 19, 2021   (CN) .......................... 202110294274.6

(51) Int. Cl.
*H01L 21/48*     (2006.01)
*H01L 23/29*     (2006.01)
(Continued)

(52) U.S. Cl.
CPC ...... *H01L 23/5386* (2013.01); *H01L 21/4857* (2013.01); *H01L 21/486* (2013.01);
(Continued)

(58) Field of Classification Search
CPC ............. H01L 23/5386; H01L 21/4857; H01L 21/486; H01L 23/291; H01L 23/293;
(Continued)

(56) References Cited

U.S. PATENT DOCUMENTS

2013/0020710 A1* 1/2013 Chew ................ H01L 23/49861
257/762
2017/0194292 A1* 7/2017 Yu .......................... H01L 21/78
(Continued)

FOREIGN PATENT DOCUMENTS

CN    107393880 A   * 11/2017   .......... H01L 23/3114
CN    111106013 A      5/2020

*Primary Examiner* — Evan G Clinton
(74) *Attorney, Agent, or Firm* — The PL Law Group, PLLC

(57) ABSTRACT

A multilayer embedded packaging structure according to an embodiment includes a first dielectric layer and a second dielectric layer on the first dielectric layer. The first dielectric layer includes a first wiring layer. The second dielectric layer includes a first copper pillar layer and a device placement port frame penetrating through the second dielectric layer in a height direction, and a second wiring layer on the first copper pillar layer. A second copper pillar layer is on the second wiring layer. The first wiring layer and the second wiring layer are conductively connected via the first copper pillar layer. A first device is mounted to the bottom of the device placement port frame, a second device is mounted to the second dielectric layer, and a third device is mounted to an end of the second copper pillar layer.

13 Claims, 9 Drawing Sheets

(51) Int. Cl.
*H01L 23/31* (2006.01)
*H01L 23/538* (2006.01)
*H01L 25/065* (2023.01)
*H01L 25/10* (2006.01)
*H01L 23/00* (2006.01)
*H01L 23/498* (2006.01)

(52) U.S. Cl.
CPC .......... *H01L 23/291* (2013.01); *H01L 23/293* (2013.01); *H01L 23/3121* (2013.01); *H01L 25/0652* (2013.01); *H01L 25/105* (2013.01); *H01L 23/49822* (2013.01); *H01L 23/49838* (2013.01); *H01L 24/16* (2013.01); *H01L 2224/16235* (2013.01)

(58) Field of Classification Search
CPC ............. H01L 23/3121; H01L 25/0652; H01L 25/105; H01L 23/49822; H01L 23/49838; H01L 24/16; H01L 2224/16235; H01L 23/13; H01L 23/3128; H01L 23/49811; H01L 23/5384; H01L 25/03; H01L 2221/68359; H01L 21/56; H01L 21/6835; H01L 2224/16238; H01L 2225/06513; H01L 2225/06517; H01L 2225/06555; H01L 2225/06568; H01L 2225/06582; H01L 2924/15156; H01L 2924/15313; H01L 23/3114; H01L 25/0657; H01L 2225/06524; H01L 21/4825; H01L 21/485; H01L 21/4853; H01L 21/52; H01L 2225/06527; H01L 2225/06548
See application file for complete search history.

(56) References Cited

U.S. PATENT DOCUMENTS

2018/0116057 A1* 4/2018 Kajihara .............. H05K 3/0032
2021/0366801 A1* 11/2021 Iwamoto ................ H01L 23/13

* cited by examiner

EMBEDDED PACKAGING STRUCTURE AND MANUFACTURING METHOD THEREOF

CROSS-REFERENCE TO RELATED APPLICATION(S)

This application claims priority to Chinese patent application no. 202110294274.6 filed on Mar. 19, 2021 in the Chinese intellectual property office, the entire disclosure of which is incorporated by reference herein.

BACKGROUND

1. Technical Field

The present invention relates to a packaging structure for an electronic device, and in particular to an embedded packaging structure and a manufacturing method thereof.

2. Description of the Related Art

With the rapid development of electronic technology, electronic products spring up, related electronic products go further and further on the road of intellectualization and integration, and the miniaturization and integration of related electronic products become the mainstream of the market. The miniaturization and intellectualization mean that each electronic component constituting the core part of the electronic products demands higher requirements, and how to manufacture lower cost, faster speed, more reliable performance and smaller dimension are the goals of integrated circuit packaging.

Semiconductor front-end wafer manufacture changes from the original tens of nanometers to more than ten nanometers to even fewer than ten nanometers with the technology continuing to expand to make various breakthroughs. The integrated circuit packages are ushering into a future that the integration density of individual electronic devices is increased by constantly decreasing minimum feature dimensions.

Currently, the advanced packaging methods include: Wafer Level Chip Scale Packaging (WLCSP), Fan-Out Wafer Level Package (FOWLP), FlipChip, Package on Package (POP), and Fan-out Panel level Package (FOPLP). The fan-out package has unique advantages over the conventional wafer level package: (1) having flexible I/O spacing, independent of chip dimension; (2) only using active die, thereby improving the product yield; (3) having a flexible 3D packaging path, namely, making it possible to form an arbitrary array of patterns at the top; (4) having good electrical performance and thermal performance; (5) high frequency applications; and (6) being easy to realize high-density wiring in a redistribution layer (RDL). The fan-out packaging method is generally: providing a carrier substrate, and forming an adhesive layer on the surface of the substrate; performing photolithography and electroplating to obtain redistribution layers (RDL) on the adhesive layer; mounting a semiconductor chip on the redistribution layers by using a chip bonding process; using an injection molding process to plastically package a semiconductor chip in a plastic packaging material layer; removing the substrate and the adhesive layer; performing photolithography and electroplating on the redistribution layers to form an under bump metallurgy layer (UBM); and performing ball mount reflow on the UBM to form a solder bump.

The panel level package in fan-out package accommodates several times as many components and parts as wafer level due to the larger substrate dimension compared with the wafer level package, which is more cost-effective in meeting the same competition in process capability.

The fan-out packaging structure has the defects of insufficient input/output ports, large dimensions of packaging structure, etc. How to address the insufficient number of input/output ports in a panel level fan-out package and how to reduce product dimension become key points.

In the prior art, CN111106013A discloses a preparation method of TMV (Through Molding Via) structure, and a large-board fan-out type heterogeneous integrated packaging structure. As shown in FIG. 1, the packaging structure uses a board level technology to make a chip plastic package plate 10, uses a laser electroplating method to make a TMV structure 12, provides an antenna 13 and a surface-mount element 11 and makes a connection circuit 15 to be connected, and makes a redistribution layer 16 and a solder ball 17 on the other side of the plastic package plate.

However, the laser or drilling process technology of the prior art has low processing efficiency and high production cost; whether the TMV is made with laser or machining drilling related process, it has poor machining accuracy, and singular structure, shape, and dimension, and the TMV structure with large dimension and multi-shape cannot be well handled; in laser porefilling electroplating, the bonding force between the copper pillar and the dielectric layer is poor (the outer surface of the copper pillar cannot be treated), which affects the product reliability; in addition, the copper pillar by laser porefilling electroplating is tapered from top to bottom, and the difference in the longitudinal dimension of the copper pillar is not conducive to heat dissipation and signal transmission and stability.

SUMMARY

Embodiments of the present invention involve providing an embedded packaging structure and a manufacturing method thereof to solve the above technical problems. According to the present invention, devices are implanted after the circuit layout, wherein the devices can be selectively implanted according to the yield of the substrate, so as to reduce the loss of the devices; the devices, by a POP back-to-back stacked manner, increase the I/O number and reduce the area ratio when the devices are arranged horizontally; the pattern of the circuit and the copper pillar can be set arbitrarily according to practical requirements, and can be realized only by electroplating the pattern image; the upper and lower dimensions of the circuit and the copper pillar are uniform, which is more advantageous for the heat dissipation of the package and the signal transmission stability; the surface of the copper pillar is browned after electroplating the copper pillar, which increases the bonding force between the copper pillar and the dielectric layer.

The first aspect of the present invention relates to a multilayer embedded packaging structure, comprising a first dielectric layer and a second dielectric layer on the first dielectric layer, wherein the first dielectric layer comprises a first wiring layer, and the second dielectric layer comprises a first copper pillar layer penetrating through the second dielectric layer in a height direction, a device placement port frame, and a second wiring layer on the first copper pillar layer; a second copper pillar layer is provided on the second wiring layer, and the first wiring layer and the second wiring layer are conductively connected via the first copper pillar layer; a first device is mounted to a bottom of the device placement port frame such that a terminal of the first device is in conductive connection with the first wiring layer, a second device is mounted to the second dielectric layer such that the terminal of the second device is in conductive connection with the second wiring layer, and a third device is mounted to an end of the second copper pillar layer such that the terminal of the third device is in conductive connection with the second copper pillar layer.

In some embodiments, gaps between the first device and the second device, and the packaging structure are filled with a dielectric material to form a plastic package layer.

In some embodiments, the first dielectric layer and the second dielectric layer comprise an organic dielectric material, an inorganic dielectric material, or a combination thereof. Preferably, the first dielectric layer and the second dielectric layer comprise polyimide, epoxy resin, bismaleimide triazine resin, ceramic filler, glass fiber, or a combination thereof.

In some embodiments, the third device is covered with a third dielectric layer.

In some embodiments, the first device and the second device comprise a device having a double-sided terminal such that the terminal of the second device is in conductive connection with the terminal of the first device and the terminal of the second device is in conductive connection with the terminal of the third device.

Preferably, the first device, the second device, and the third device comprise at least one device respectively.

In some embodiments, a solder mask and a solder resist window are provided on the bottom surface of the first dielectric layer.

The second aspect of the present invention provides a manufacturing method for a multilayer embedded packaging structure, comprising steps of:
(a) forming a first wiring layer on a temporary carrier plate, laminating a first dielectric layer on the first wiring layer, and thinning the first dielectric layer to expose the above-mentioned first wiring layer;
(b) forming a first copper pillar layer on the first dielectric layer, the first copper pillar layer comprising a sacrificial copper pillar, laminating a second dielectric layer on the first copper pillar layer, and thinning the second dielectric layer to expose the first copper pillar layer;
(c) forming a second wiring layer on the second dielectric layer, such that the first wiring layer and the second wiring layer are in conductive connection through the first copper pillar layer;
(d) forming a second copper pillar layer on the second wiring layer;
(e) etching the sacrificial copper pillar to form a device placement port frame exposing the first wiring layer; and (f) removing the temporary carrier plate.

In some embodiments, the manufacturing method further includes:
(g) mounting a first device on the bottom of the device placement port frame such that a terminal of the first device is in conductive connection with the first wiring layer;
(h) mounting a second device on the second wiring layer such that the terminal of the second device is in conductive connection with the second wiring layer;
and (i) mounting a third device on an end of the second copper pillar layer such that the terminal of the third device is in conductive connection with the second copper pillar layer.

Preferably, the manufacturing method further comprises:
(h') after step h and before step i, filling a dielectric material to form a plastic package layer covering the first device and the second device.

Preferably, the manufacturing method further comprises:
(i') after step i, laminating a dielectric material to form a plastic package layer covering the third device.

In some embodiments, step (a) further comprises:
(a1) applying a first photoresist layer on the temporary carrier plate, and performing exposure and development to form a first feature pattern;
(a2) performing electroplating in the first feature pattern to form a first wiring layer and removing the first photoresist layer;
and (a3) laminating a first dielectric layer on the first wiring layer, and thinning the first dielectric layer to expose the first wiring layer.

Preferably, the temporary carrier plate comprises a double-sided copper-clad plate, wherein the double-sided copper-clad plate comprises a prepreg, a first copper layer on a surface of the prepreg, and a second copper layer on the first copper layer, the first copper layer and the second copper layer being attached together by physical press-fitting. Preferably, step (e) comprises removing the double-sided copper-clad plate by physically separating the first copper layer and the second copper layer and etching the second copper layer.

In some embodiments, step (f) further comprises:
(b1) forming a metal seed layer on the first dielectric layer;
(b2) applying a second photoresist layer on the metal seed layer, and exposing and developing to form a second feature pattern;
(b3) performing electroplating in the second feature pattern to form an etch resist layer;
(b4) applying a third photoresist layer, and exposing and developing to form a third feature pattern;
(b5) performing electroplating in the third feature pattern to form a first copper pillar layer, and a sacrificial copper pillar on the etch resist layer, and removing the second photoresist layer and the third photoresist layer;
and (b6) laminating a second dielectric layer over the first feature layer and the sacrificial copper pillar, and thinning the second dielectric layer to expose the first feature layer and the sacrificial copper pillar.

In some embodiments, the etch resist layer comprises nickel, titanium, or a combination thereof. In some embodiments, step (c) further comprises:
(c1) forming a metal seed layer on the second dielectric layer;
(c2) applying a fourth photoresist layer on the metal seed layer, and exposing and developing to form a fourth feature pattern;
and (c3) electroplating copper in the fourth feature pattern to form a second wiring layer, and removing the fourth photoresist layer.

In some embodiments, step (d) comprises:
(d1) applying a fifth photoresist layer on the second wiring layer, and performing exposure and development to form a fifth feature pattern;
(d2) electroplating copper in the fifth feature pattern to form a second copper pillar layer;
and (d3) removing the fifth photoresist layer and etching the exposed metal seed layer. Preferably, the metal seed layer comprises titanium, copper, a titanium-tungsten alloy, or a combination thereof.

In some embodiments, step (d) further comprises:
(d1) applying a sixth photoresist layer on the second wiring layer, and exposing and developing to form a sixth feature pattern;

and (d2) etching the sacrificial copper pillar and the etch resist layer in the sixth feature pattern to form a device placement port frame.

In some embodiments, the manufacturing method further comprises after removing the temporary carrier plate in step f, applying a solder resist layer on a bottom surface of the first dielectric layer and surface treating exposed metal to form a solder resist window.

BRIEF DESCRIPTION OF THE DRAWINGS

For a better understanding of the present invention and to show the implementation mode thereof, reference will now be made, purely by way of example, to the accompanying drawings.

With specific reference to the accompanying drawings, it must be stressed that the particular graphical representations shown are by way of example and for purposes of illustrative discussion of preferred embodiments of the present invention only, and are presented in the cause of providing what is believed to be the most useful and readily understood graphical representations of the description of the principles and conceptual aspects of the present invention. In this regard, no attempt is made to show structural details of the present invention in more details than is necessary for a fundamental understanding of the present invention; the description with reference to the accompanying drawings makes it apparent to those skilled in the art how several forms of the present invention may be embodied in practice.

In the drawings:

FIG. 1 is a schematic cross-sectional view of a preparation method for a TMV structure and a large plate fan-out heterogeneous integrated packaging structure in the prior art;

FIG. 2 is a schematic cross-sectional view of an embedded packaging structure according to one embodiment of the present invention;

FIG. 3 is a schematic cross-sectional view of an embedded packaging structure according to another embodiment of the present invention;

FIG. 4 is a schematic cross-sectional view of an embedded packaging structure according to another embodiment of the present invention;

FIG. 5 is a schematic cross-sectional view of an embedded packaging structure according to another embodiment of the present invention;

FIGS. 6A-6P show schematic cross-sectional views of an intermediate structure at various steps of a method for manufacturing a packaging structure according to one embodiment of the present invention.

DETAILED DESCRIPTION

Figure 1:
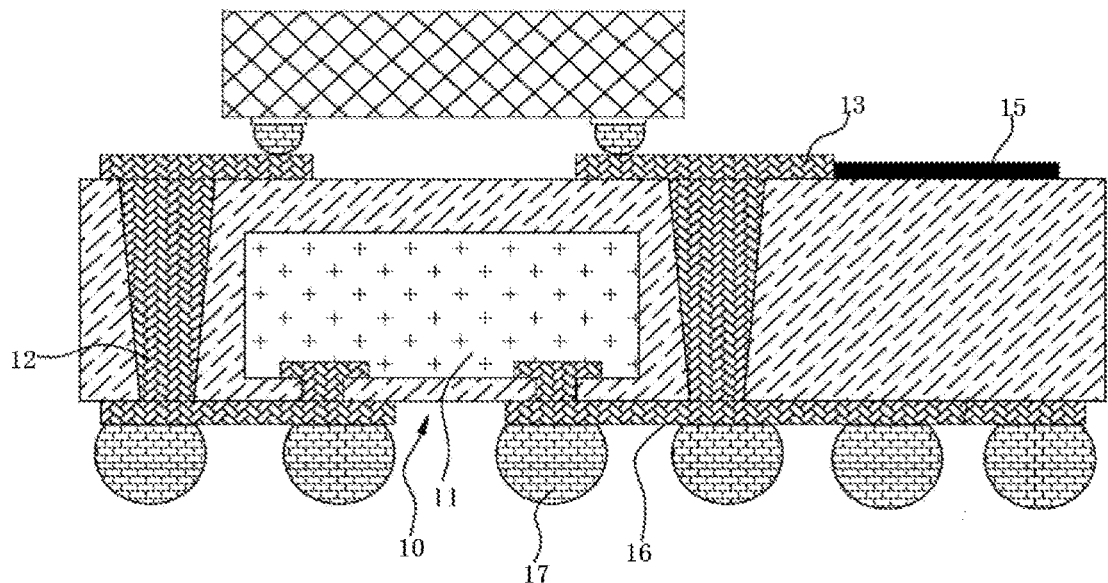
Figure 2:
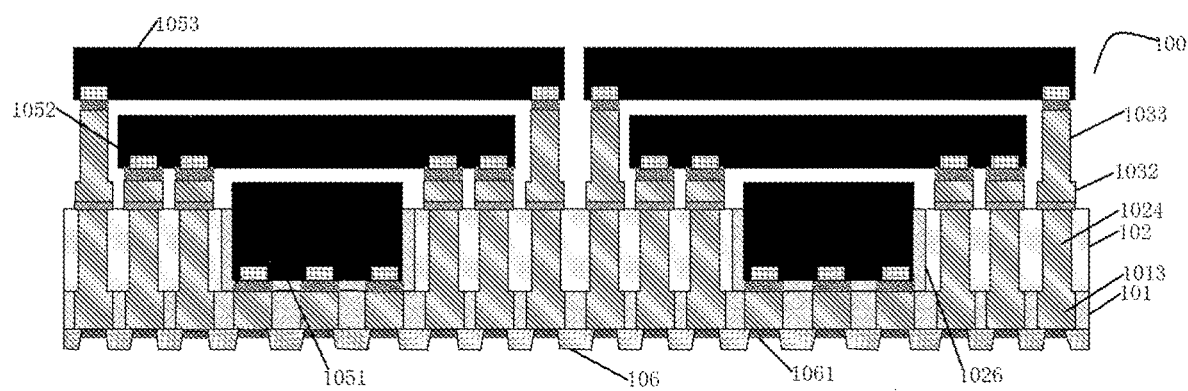

Referring to FIG. 2, a schematic cross-sectional view of an embedded packaging structure 100 is shown. The packaging structure 100 includes a first dielectric layer 101 and a second dielectric layer 102 on the first surface of the first dielectric layer 101. The first dielectric layer 101 and the second dielectric layer 102 may comprise the same material or different materials; and may comprise organic dielectric materials, inorganic dielectric materials or combinations thereof, preferably, polyimides, epoxy resins, bismaleimide triazine resins (BT), ceramic filler, glass fibers, or combinations thereof.

The first dielectric layer 101 comprises a first wiring layer 1013, the first wiring layer 1013 is exposed on the first surface of the first dielectric layer 101, the second dielectric layer 102 comprises a first through-hole pillar 1024 penetrating the second dielectric layer 102 in a height direction and a device placement port frame 1026, the second dielectric layer 102 is provided thereon with a second wiring layer 1032, the second wiring layer 1032 is provided thereon with a second through-hole pillar 1033, and the first wiring layer 1013 and the second wiring layer 1032 are conductively connected via the first through-hole pillar 1024. The second dielectric layer 102 includes a first copper pillar layer 1024, which serves as an IO channel for the copper through-hole pillar and may have the same or different cross-sectional dimensions. The second copper pillar layer 1033 also serves as an IO channel. Arranging the wiring layer before implanting a device allows selective implantation according to the yield of the substrate, thereby reducing device losses.

The bottom of the device placement port frame 1026 is mounted with a first device 1051, the second wiring layer 1032 is mounted thereon with a second device 1052, the end of the second copper pillar layer 1033 is mounted with a third device 1053, and the gap between the first device 1051 and the second device 1052 and the structure 100 can be filled with a dielectric material to form a plastic package layer. With the back-to-back stacked arrangement adopted by the first device 1051, the second device 1052, and the third device 1053, the number of I/O per unit area can be significantly increased, thereby reducing the area ratio when the devices are arranged horizontally.

As shown in FIG. 2, the packaging structure 100 further includes a solder resist layer 106 formed on the second surface of the first dielectric layer 101, a solder resist window 1061 being provided in the solder resist layer 106.

Figure 3:
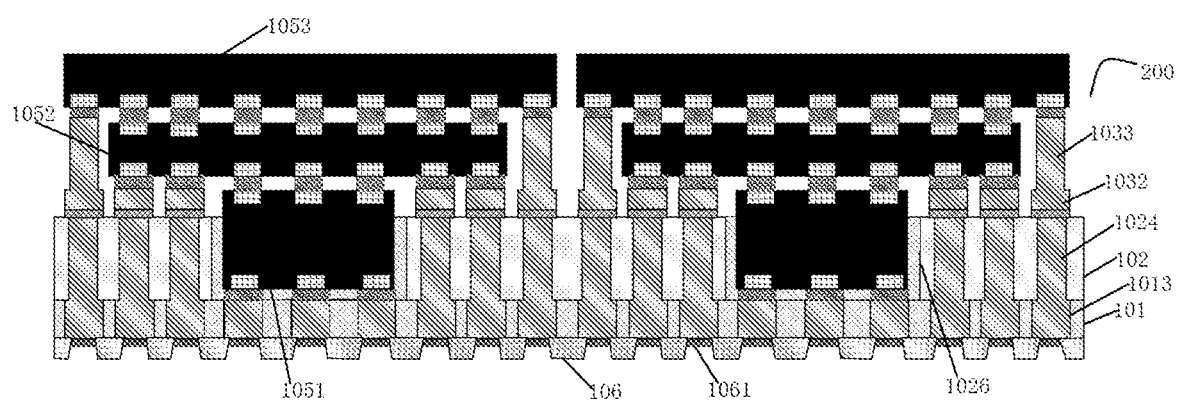

Referring to FIG. 3, a schematic cross-sectional view of an embedded packaging structure 200 is shown. The difference between the packaging structure 200 and the packaging structure 100 is that the first device 1051 and the second device 1052 each has a double-sided terminal, wherein the terminal of the first device 1051 is in conductive connection with the terminal of the second device 1052, and the terminal of the second device 1052 is in conductive connection with the terminal of the third device 1053.

Figure 4:
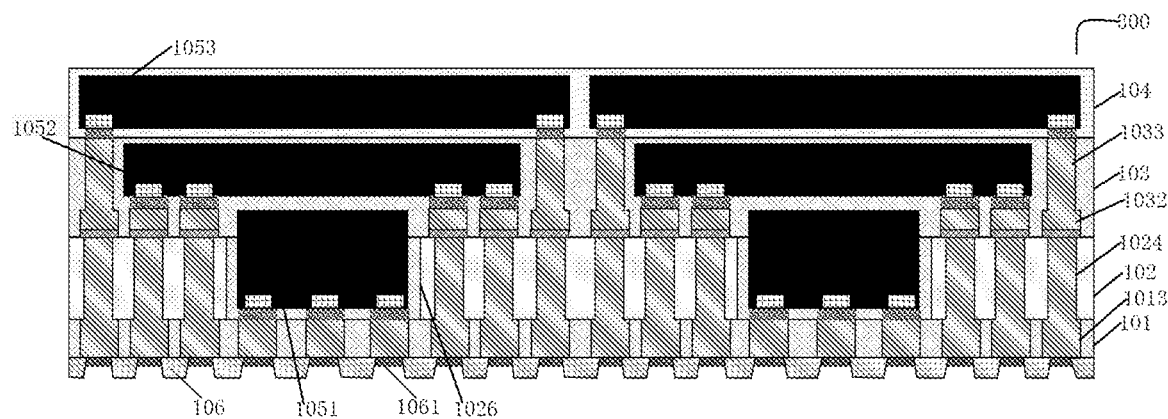

Referring to FIG. 4, a schematic cross-sectional view of an embedded packaging structure 300 is shown. The packaging structure 300 differs from the packaging structure 100 in that a third dielectric layer 103 is provided on the second dielectric layer 102, and the third dielectric layer 103 covers the second wiring layer 1032 and a second through-hole pillar 1033; a fourth dielectric layer 104 is provided on the third dielectric layer 103, and the fourth dielectric layer 104 covers the third device 1053. The third dielectric layer 103 and the first dielectric layer 101 may comprise the same material or different materials; the fourth dielectric layer 104 and the first dielectric layer 101 may comprise the same material or different materials. Preferably, the fourth dielectric layer 104 is selected from an organic dielectric material or a photosensitive dielectric material, for example, the organic dielectric material may be ABF or PP, and the photosensitive dielectric material may be PID.

Figure 5:
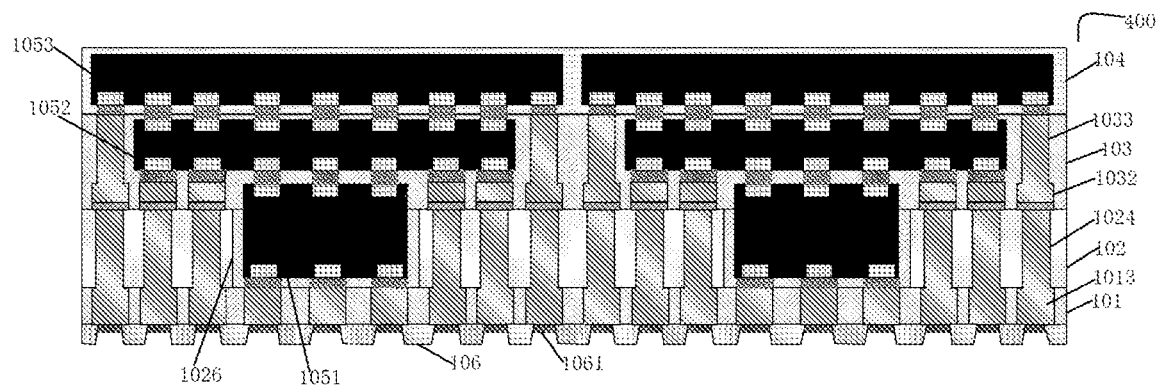

Referring to FIG. 5, a schematic cross-sectional view of an embedded packaging structure 400 is shown. The difference between the packaging structure 400 and the packaging structure 300 is that the first device 1051 and the second device 1052 each has a double-sided terminal, wherein the terminal of the first device 1051 is in conductive connection with the terminal of the second device 1052, and the terminal of the second device 1052 is in conductive connection with the terminal of the third device 1053.

Figure 6A:
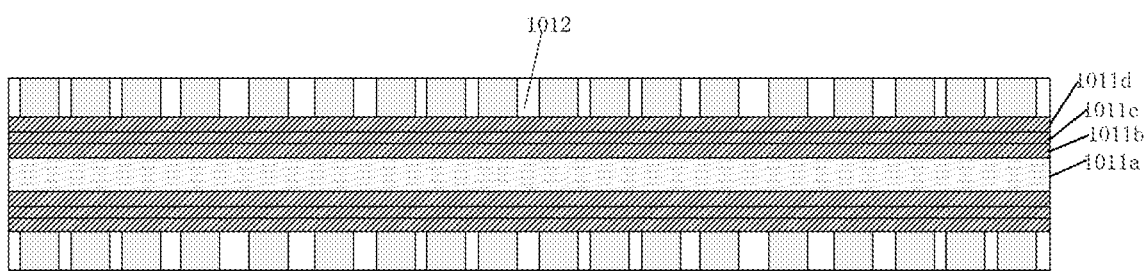
Figure 6B:
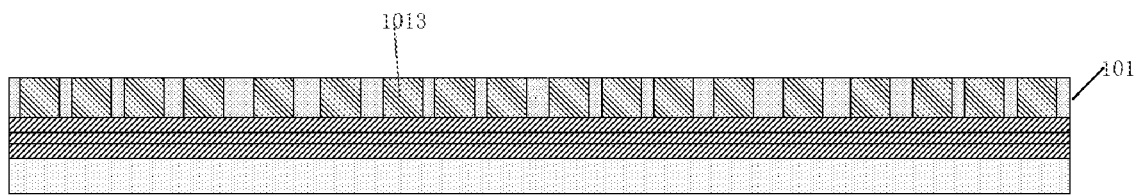
Figure 6C:
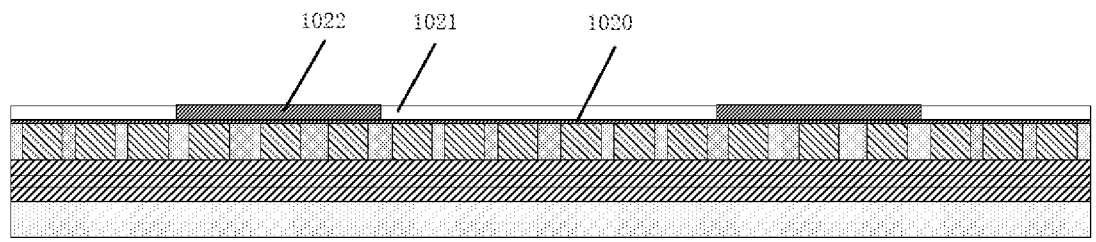
Figure 6D:
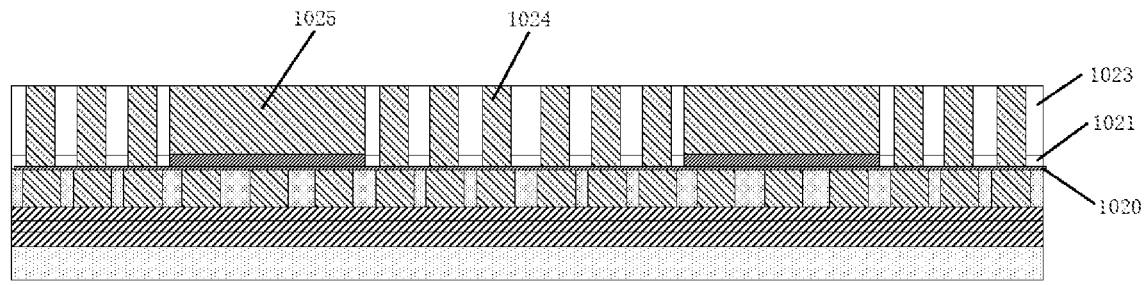
Figure 6E:
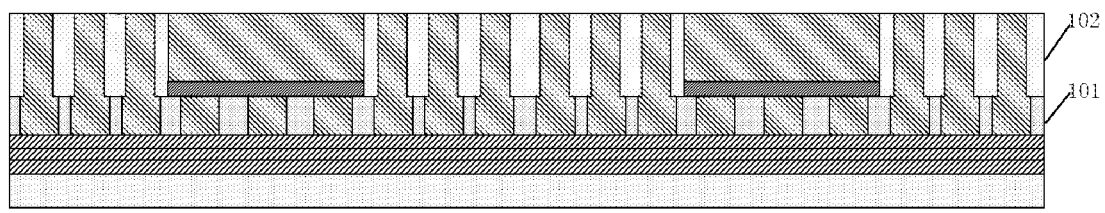
Figure 6F:
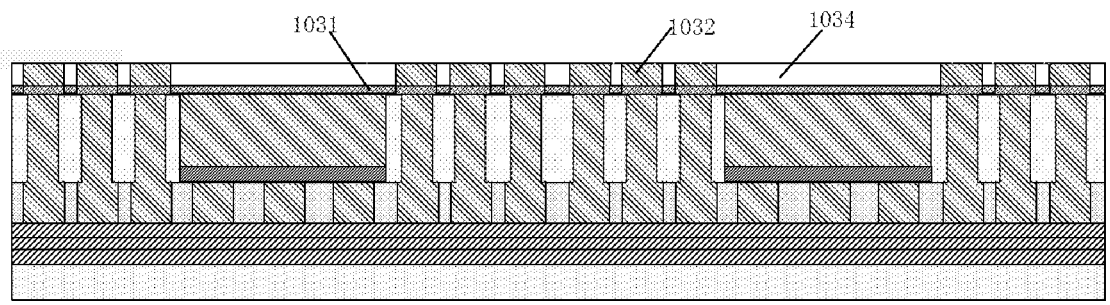
Figure 6G:
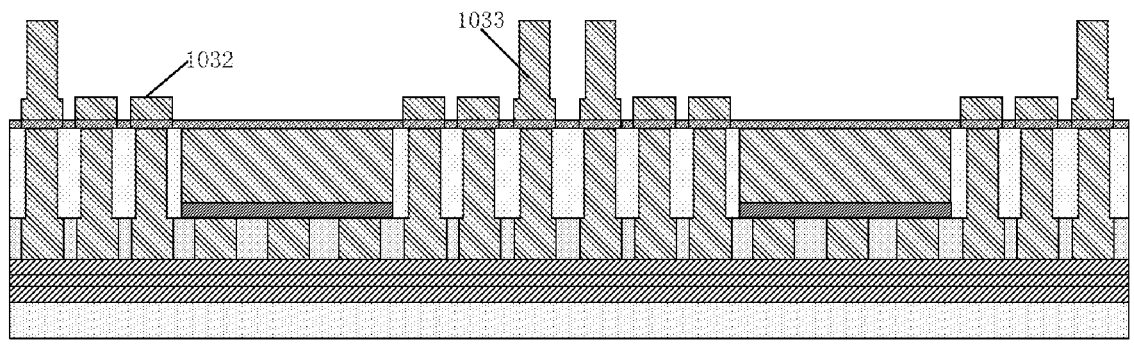
Figure 6H:
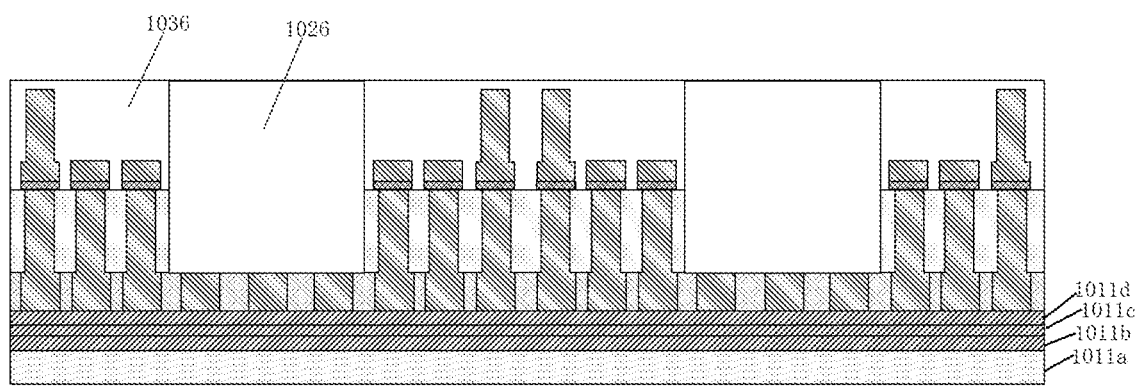
Figure 6I:
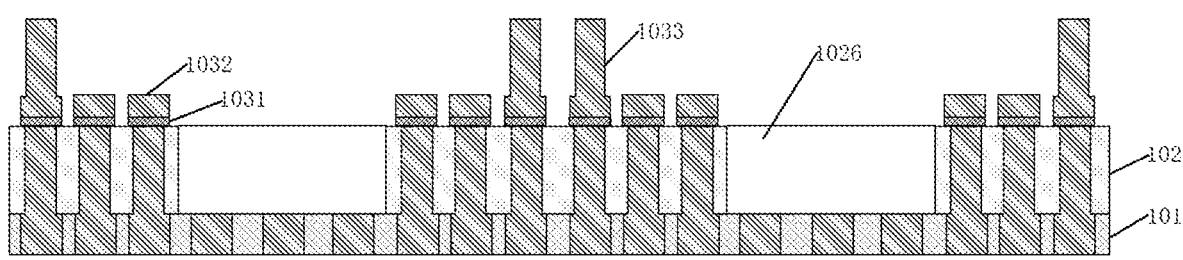
Figure 6J:
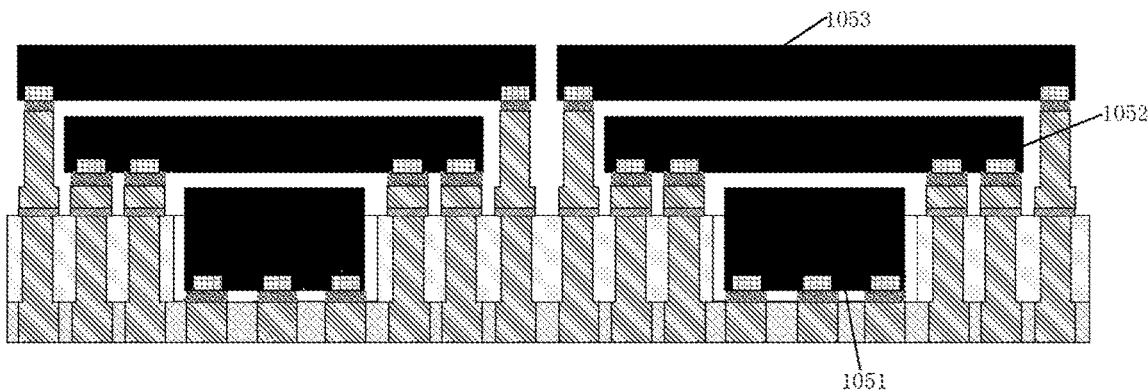
Figure 6K:
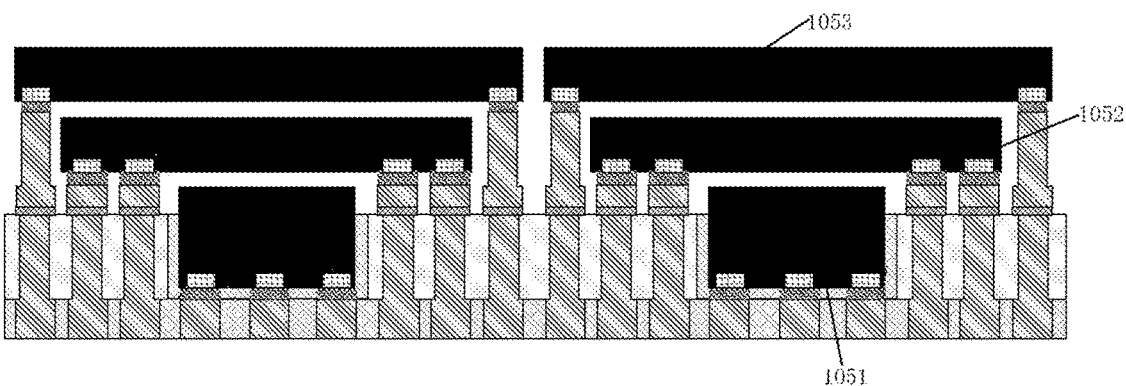
Figure 6L:
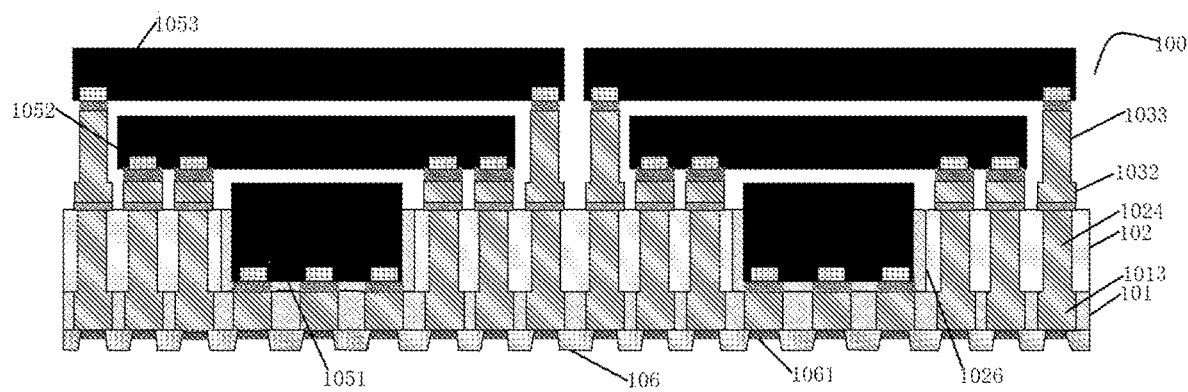
Figure 6M:
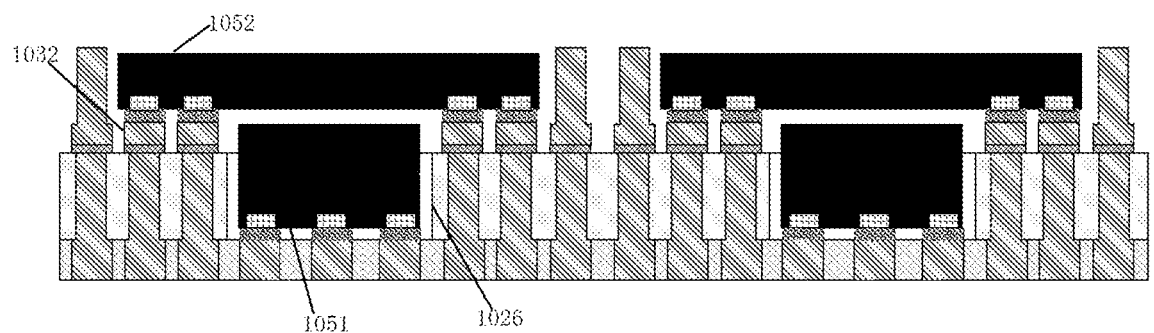
Figure 6N:
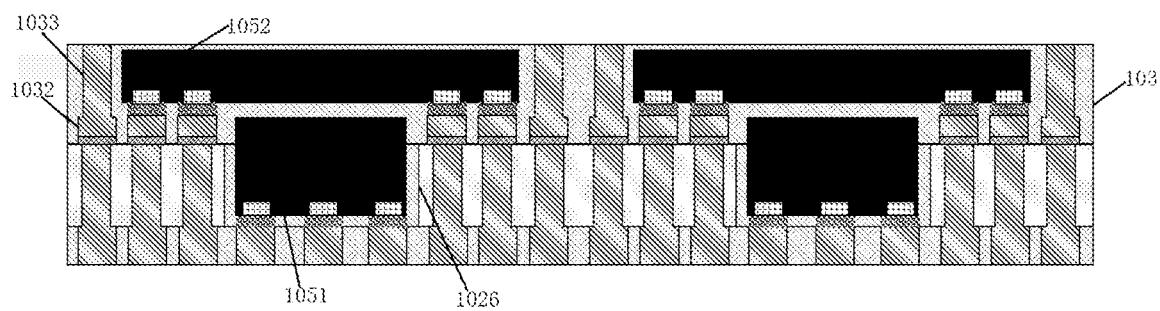
Figure 6O:
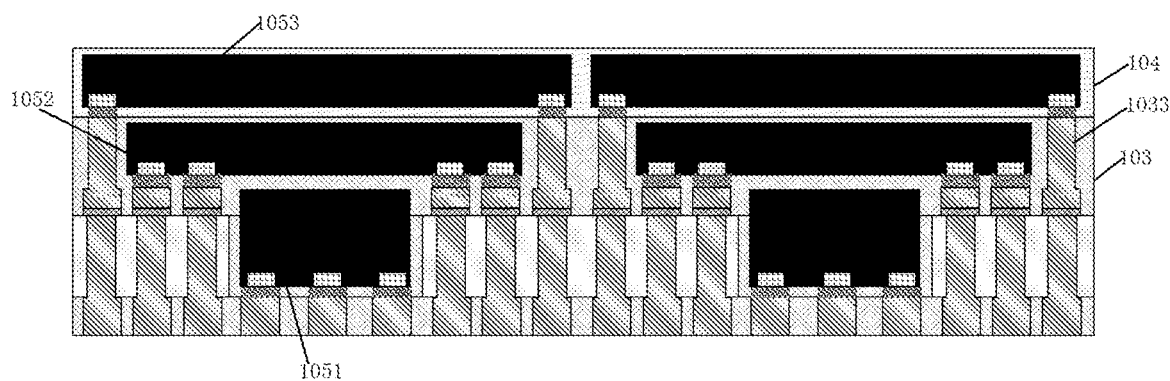
Figure 6P:
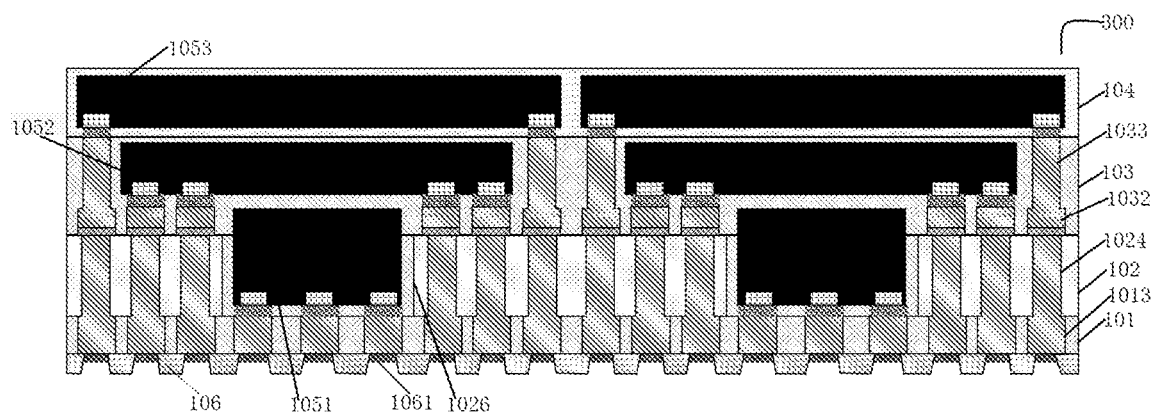

Referring to FIGS. 6A-6P, schematic cross-sectional views of an intermediate structure at various steps of a method for manufacturing a multilayer embedded packaging structure according to one embodiment of the present invention are shown.

The manufacturing method comprises the steps of: preparing a temporary carrier plate, such as a double-sided copper-clad plate DTF 10, applying a first photoresist layer 1012 on at least one side of the DTF 10, and exposing and developing to form a first feature pattern, step (a), as shown in FIG. 6A. The DTF 10 comprises a PP (prepreg) layer 1011a, and the PP layer 1011a is successively a first copper layer 1011b located on the surface of the PP layer 1011a, a second copper layer 1011c located on the surface of the first copper layer 1011b, and a protective layer 1011d located on the surface of the second copper layer 1011c in an outward way; the first copper layer 1011b and the second copper layer 1011c are formed by physically press-fitting copper foils, and the first copper layer 1011b and the second copper layer 1011c can be physically separated, facilitating the removal of the DTF10 in the subsequent process; the protective layer 1011d may comprise copper, titanium, nickel, tungsten or a combination thereof; the thickness of the first copper layer 1011b, the second copper layer 1011c, and the protective layer 1011d can be adjusted according to practical requirements, and preferably, the thickness of the first copper layer 1011b is 18 μm, the thickness of the second copper layer 1011c is 3 μm, and the thickness of the protective layer 1011d is 3-10 μm. Generally, the first photoresist layer 1012 may be applied simultaneously to two sides of the DTF10 and exposed and developed to form a first feature pattern. In this embodiment, only a single unit on one side of the DTF10 is subsequently demonstrated, but it is not limited to performing subsequent operations on only one side of the DTF10.

Next, in the pattern, copper is electroplated to form the first wiring layer 1013, the first photoresist layer 1012 is removed, the dielectric material is laminated, and the dielectric material is thinned to expose the surface of the first wiring layer 1013 to form the first dielectric layer 101, step (b), as shown in FIG. 6B. Generally, in order to ensure a filling effect, the amount of the dielectric material is calculated based on the filling amount, and preferably, the dielectric material is 5-20 μm higher than the surface of the first wiring layer 1013; the dielectric material may comprise an organic dielectric material, an inorganic dielectric material, or a combination thereof, and preferably, the dielectric material comprises polyimide, epoxy resin, bismaleimide triazine resin, ceramic filler, glass fiber, or a combination thereof. Being divided according to functional requirements, the dielectric material may be selected from a photosensitive material and a non-photosensitive material, and preferably, the dielectric material adopts a photosensitive dielectric material. The dielectric material can be thinned integrally by means of grinding plate or plasma etching, and can also be thinned locally by means of laser or drilling; when the dielectric material adopts a photosensitive material, the dielectric material can also be locally thinned by means of exposure and development.

Then, a metal seed layer 1020 is formed on the first surface of the first dielectric layer 101, a second photoresist layer 1021 is applied on the metal seed layer 1020, via exposure and development, a second feature pattern is formed, and electroplating is performed in the pattern to form an etch resist layer 1022, step (c), as shown in FIG. 6C. Generally, the etch resist layer 1022 can comprise nickel, titanium, or a combination thereof, for example, an 8-15 μm nickel layer. Generally, the metal seed layer 1020 can be formed on the first dielectric layer 101 by means of electroless plating or sputtering, wherein the metal seed layer 1020 can comprise titanium, copper, a titanium-tungsten alloy, or a combination thereof, and the thickness of the metal seed layer 1020 ranges from 0.8 μm to 5 μm; preferably, the metal seed layer 1020 is made by sputtering with 0.1 μm titanium and 1 μm copper.

Next, a third photoresist layer 1023 is applied, and exposure and development are performed to form a third feature pattern in which copper is electroplated to form a first copper pillar layer 1024 and a sacrificial copper pillar 1025, step (d), as shown in FIG. 6D. Generally, after the first copper pillar layer 1024 is formed, a browning treatment can be performed on the surface of the first copper pillar layer 1024, so as to increase the bonding force between the first copper pillar layer 1024 and the dielectric layer coated on the outside thereof; the shape of the first copper pillar layer 1024 may be set according to actual requirements, for example, it may be square, circular, etc. without limitation. The thickness of the sacrificial copper pillar 1025 may be adjusted according to the thickness of the device. The first copper pillar layer 1024 has uniform upper and lower dimensions, which is more advantageous for heat dissipation and signal transmission stability of the embedded packaging structure. The sacrificial copper pillar 1025 is located on the surface of the etch resist layer 1022 such that the etch resist layer 1022 can protect the first wiring layer 1013 from etching when the sacrificial copper pillar 1025 is subsequently etched.

Then, the second photoresist layer 1021 and the third photoresist layer 1023 are removed, the dielectric material is laminated, and the dielectric material is thinned to expose the first copper pillar layer 1024 and the sacrificial copper pillar 1025 to form the second dielectric layer 102, step (e), as shown in FIG. 6E.

Next, a second wiring layer 1032 is formed on the second dielectric layer 102, step (f), as shown in FIG. 6F. Generally, the following steps are included:

forming a metal seed layer 1031 on the second dielectric layer 102;

applying a fourth photoresist layer 1034 on the metal seed layer 1031, and performing exposure and development to form a fourth feature pattern;

and electroplating copper in a pattern to form a second wiring layer 1032.

Generally, the metal seed layer 1031 can be formed on the second dielectric layer 102 by means of electroless plating or sputtering, wherein the metal seed layer 1031 can comprise titanium, copper, a titanium-tungsten alloy, or a combination thereof, and the thickness of the metal seed layer 1031 ranges from 0.8 μm to 5 μm; preferably, the metal seed layer 1031 is made by sputtering with 0.1 μm titanium and 1 μm copper.

Then, a second copper pillar layer 1033 is formed on the second wiring layer 1032, step (g), as shown in FIG. 6G. Generally, the following steps are included:

applying a fifth photoresist layer, and exposing and developing to form a fifth feature pattern;

electroplating copper in a pattern to form a second copper pillar layer 1033;

and removing the fourth photoresist layer 1034 and the fifth photoresist layer, and etching the exposed metal seed layer 1031.

Generally, the shape of the second copper pillar layer 1033 can be set according to practical requirements, for example, it can be square, circular, etc. without specific limitation; the second copper pillar layer 1033 has uniform upper and lower dimensions, which is more advantageous for heat dissipation and signal transmission stability of the embedded packaging structure. After the second copper pillar layer 1033 is formed by electroplating, a browning treatment may also be performed on the surface of the second copper pillar layer 1033 so as to increase the bonding force between the second copper pillar layer 1033 and the dielectric layer coated on the outside thereof.

Next, a sixth photoresist layer 1036 is applied, exposure and development are performed to form a sixth feature pattern, the sacrificial copper pillar 1025 is etched and the protective layer 1022 is etched to form a device placement port frame 1026, step (h), as shown in FIG. 6H.

Generally, the sixth photoresist layer 1036 can be applied on the second copper pillar layer 1033 and the second wiring layer 1032 to protect the second copper pillar layer 1033 and the second wiring layer 1032 from being etched when the sacrificial copper pillar 1025 is subsequently etched; the sixth photoresist layer 1036 is exposed and developed to expose the sacrificial copper pillar 1025, the sacrificial copper pillar 1025 is etched and the protective layer 1022 is etched.

Then, the whole plate is applied with a seventh photoresist layer and is exposed and cured, the first copper layer 1011*b* and the second copper layer 1011*c* are separated, the second copper layer 1011*c* and the protective layer 1011*d* are etched, and the sixth photoresist layer 1036 and the seventh photoresist layer are removed to form a substrate, step (i), as shown in FIG. 6I. The seventh photoresist layer is applied to protect the substrate during the removal of the DTF10. The present invention may merely provide a substrate provided with a wiring layer and a through-hole pillar, and then a packaging manufacturer may further mount a device, and then package the same, thereby eliminating process equipment input such as pattern electroplating for the subsequent packaging manufacturer.

Next, proceeding step (i), a first device 1051 is mounted on the bottom of the device placement port frame 1026, a second device 1052 is mounted on the surface of the second wiring layer 1032, and a third device 1053 is mounted on the end of the second copper pillar layer 1033, step (j), as shown in FIG. 6J. Generally, each device has two terminal faces corresponding to each other, or has a single-sided terminal face and a non-terminal face corresponding to the single-sided terminal face, and the device can realize the electrical signal connection between the terminal and the substrate by solder. A device with a single-sided terminal face is taken as an example to perform subsequent process description; when mounting a device, in one case, solder can be applied by printing or solder dispensing on the bottom of the device placement port frame 1026, the surface of the second wiring layer 1032, and the end of the second copper pillar layer 1033, and then the device is mounted, and then reflow soldering is performed; in one case, solder may be affixed to the terminal surfaces of the first device 1051, the second device 1052, and the third device 1053, and they are mounted to the bottom of the device placement port frame 1026, the surface of the second wiring layer 1032, and the end of the second copper pillar layer 1033, respectively, and then reflow soldering is performed. The solder may include solder paste and silver paste. The devices are implanted after the circuit layout, wherein the devices can be selectively implanted according to the yield of the substrate, so as to reduce the loss of the devices; the devices are implanted in a back-to-back stacked manner, increasing the I/O number and reducing the area ratio when the devices are arranged horizontally.

The dielectric material is then filled to fill the gap between the first device 1051 and the device placement port frame 1026, step (k), as shown in FIG. 6K. Generally, the dielectric material may be filled downward from the direction of mounting the device. Preferably, the dielectric material is selected from an organic dielectric material or a photosensitive dielectric material, for example, the organic dielectric material may be ABF or PP, and the photosensitive dielectric material may be PID.

Next, a solder mask 106 is applied to the second surface of the first dielectric layer 101, and the exposed metal is subjected to a metal surface treatment to form the solder resist window 1061, step (1), as shown in FIG. 6L. Generally, the metal surface treatment may be performed by chemical nickel-palladium gold, or OPS, or the like. If the first device 1051 and the second device 1052 have double-sided terminals, the embedded packaging structure is as shown in FIG. 3. A part of the terminal of the first device 1051 and a part of the terminal of the second device 1052 are soldered, and a part of the terminal of the second device 1052 and a part of the terminal of the third device 1053 are soldered.

Then, proceeding to step (i), the first device 1051 is mounted on the bottom of the device placement port frame 1026, and the second device 1052 is mounted on the surface of the second wiring layer 1032, step (m), as shown in FIG. 6M.

Next, the dielectric material is laminated to cover the second wiring layer 1032, the second copper pillar layer 1033, and the second device 1052, and the dielectric material is thinned to expose ends of the second copper pillar layer 1033 to form a third dielectric layer 103, step (n), as shown in FIG. 6N. Generally, the dielectric material can be laminated downward from the direction of mounting the device. In order to ensure a filling effect, the dielectric material is generally at least 5 µm higher than the end of the second copper pillar layer 1033; preferably, the dielectric material is selected from an organic dielectric material or a photosensitive dielectric material, for example, the organic dielectric material may be ABF or PP, and the photosensitive dielectric material may be PD.

Then, a third device 1053 is mounted to the end of the second copper pillar layer 1033, and the third device 1053 is plastic packaged with the dielectric material to form a fourth dielectric layer 104, step (o), as shown in FIG. 6O.

Finally, the solder mask 106 is applied on the second surface of the first dielectric layer 101 and the exposed metal is subjected to metal surface treatment to form the solder resist window 1061, step (p), as shown in FIG. 6P. If the first device 1051 and the second device 1052 have double-sided terminals, the embedded packaging structure is as shown in FIG. 5. A part of the terminal of the first device 1051 and a part of the terminal of the second device 1052 are soldered, and a part of the terminal of the second device 1052 and a part of the terminal of the third device 1053 are soldered.

It will be appreciated by technicians skilled in the art that the present invention is not limited by what has been particularly shown and described in the context. Rather, the scope of the present invention is defined by the appended claims, including both combinations and sub-combinations of the various technical features described hereinabove, as well as variations and modifications thereof, which would occur to technicians skilled in the art upon reading the foregoing description.

In the claims, the term "comprises" and variations thereof such as "comprising", "which comprises" and the like mean that the recited assembly is included, but generally not excluding other assemblies.

What is claimed is:

1. A method for manufacturing a multilayer embedded packaging structure, the method comprising:
   (a) forming a first wiring layer on a temporary carrier plate, laminating a first dielectric layer on the first wiring layer, and thinning the first dielectric layer to expose the above-mentioned first wiring layer;
   (b) forming a first copper pillar layer on the first dielectric layer, the first copper pillar layer comprising a sacrificial copper pillar, laminating a second dielectric layer on the first copper pillar layer, and thinning the second dielectric layer to expose the first copper pillar layer, the forming of the first copper pillar layer comprising:
      (b1) forming a metal seed layer on the first dielectric layer;
      (b2) applying a second photoresist layer on the metal seed layer of the first dielectric layer, and exposing and developing to form a second feature pattern;
      (b3) performing electroplating in the second feature pattern to form an etch resist layer;
      (b4) applying a third photoresist layer, and exposing and developing to form a third feature pattern;
      (b5) performing electroplating in the third feature pattern to form a first copper pillar layer, and a sacrificial copper pillar on the etch resist layer, and removing the second photoresist layer and the third photoresist layer; and
      (b6) laminating the second dielectric layer over the first feature layer and the sacrificial copper pillar, and thinning the second dielectric layer to expose the first feature layer and the sacrificial copper pillar;
   (c) forming a second wiring layer on the second dielectric layer such that the first wiring layer and the second wiring layer are in conductive connection through the first copper pillar layer;
   (d) forming a second copper pillar layer on the second wiring layer;
   (e) etching the sacrificial copper pillar to form a device placement port frame exposing the first wiring layer; and
   (f) removing the temporary carrier plate.

2. The manufacturing method according to claim 1, further comprising:
   (g) mounting a first device on a bottom of the device placement port frame such that a terminal of the first device is in conductive connection with the first wiring layer;
   (h) mounting a second device on the second wiring layer such that the terminal of the second device is in conductive connection with the second wiring layer; and
   (i) mounting a third device on an end of the second copper pillar layer such that the terminal of the third device is in conductive connection with the second copper pillar layer.

3. The manufacturing method according to claim 2, further comprising:
   (h') after step h and before step i, filling a dielectric material to cover the first device and the second device.

4. The manufacturing method according to claim 2, further comprising:
   (i') after step i, laminating a dielectric material to form a plastic package layer covering the third device.

5. The manufacturing method according to claim 1, wherein step (a) comprises:
   (a1) applying a first photoresist layer on the temporary carrier plate, and performing exposure and development to form a first feature pattern;
   (a2) performing electroplating in the first feature pattern to form a first wiring layer and removing the first photoresist layer; and
   (a3) laminating a first dielectric layer on the first wiring layer, and thinning the first dielectric layer to expose the first wiring layer.

6. The manufacturing method according to claim 1, the temporary carrier plate comprising a double-sided copper-clad plate, wherein the double-sided copper-clad plate comprises a prepreg, a first copper layer on a surface of the prepreg, and a second copper layer on the first copper layer, the first copper layer and the second copper layer being attached together by physical press-fitting.

7. The manufacturing method according to claim 6, wherein step (e) comprises removing the double-sided copper-clad plate by physically separating the first copper layer and the second copper layer and etching the second copper layer.

8. The manufacturing method according to claim 1, wherein the etch resist layer comprises nickel, titanium, or a combination thereof.

9. The manufacturing method according to claim 1, wherein step (c) comprises:
   (c1) forming a metal seed layer on the second dielectric layer;
   (c2) applying a fourth photoresist layer on the metal seed layer of the second dielectric layer, and exposing and developing to form a fourth feature pattern; and
   (c3) electroplating copper in the fourth feature pattern to form the second wiring layer, and removing the fourth photoresist layer.

10. The manufacturing method according to claim 1, wherein step (d) comprises:
    (d1) applying a fifth photoresist layer on the second wiring layer, and performing exposure and development to form a fifth feature pattern;
    (d2) electroplating copper in the fifth feature pattern to form a second copper pillar layer; and
    (d3) removing the fifth photoresist layer.

11. The manufacturing method according to claim 1, wherein the metal seed layer comprises titanium, copper, a titanium-tungsten alloy, or a combination thereof.

12. The manufacturing method according to claim 1, wherein step (d) comprises:
    (d1) applying a sixth photoresist layer on the second wiring layer, and exposing and developing to form a sixth feature pattern; and
    (d2) etching the sacrificial copper pillar and the etch resist layer in the sixth feature pattern to form a device placement port frame.

13. The manufacturing method according to claim 1, further comprising after removing the temporary carrier plate in step f, applying a solder resist layer on a bottom surface of the first dielectric layer and surface treating exposed metal to form a solder resist window.

* * * * *